US006401046B1

(12) United States Patent
Senyk et al.

(10) Patent No.: US 6,401,046 B1
(45) Date of Patent: Jun. 4, 2002

(54) MODULATED INTERFACE FOR REMOTE SIGNALS

(75) Inventors: Myron Ihor Senyk, Sterling Heights; David James Tippy, Ann Arbor; Colm Peter Boran, Novi; William Eugene Gioiosa, Jr., Dearborn Heights, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/400,772

(22) Filed: Sep. 22, 1999

(51) Int. Cl.[7] ............................................. G01R 15/00

(52) U.S. Cl. ......................... 702/57; 327/350; 324/708; 331/1 A; 365/185.03; 702/45; 702/138; 708/8

(58) Field of Search ................................ 701/2; 702/57, 702/64, 71, 79; 340/10.3 A, 870.16

(56) References Cited

U.S. PATENT DOCUMENTS

| | | | | | |
|---|---|---|---|---|---|
| 3,790,910 | A | * | 2/1974 | McCormack | 702/138 |
| 4,484,295 | A | * | 11/1984 | Bedard et al. | 708/8 |
| 4,680,582 | A | | 7/1987 | Mejia | 340/3.21 |
| 4,701,938 | A | | 10/1987 | Bell | 375/257 |
| 4,733,197 | A | * | 3/1988 | Chow | 331/1 A |
| 4,771,226 | A | * | 9/1988 | Jones | 323/303 |
| 4,952,367 | A | | 8/1990 | Porter et al. | 713/502 |
| 4,958,131 | A | * | 9/1990 | Thorn | 324/708 |
| 5,093,804 | A | | 3/1992 | Cieri et al. | 710/61 |
| 5,570,300 | A | * | 10/1996 | Henry et al. | 702/45 |
| 5,790,453 | A | * | 8/1998 | Chevallier | 365/185.03 |
| 5,940,021 | A | * | 8/1999 | Ahn | 341/155 |
| 6,066,976 | A | * | 3/2000 | Cho | 327/350 |

* cited by examiner

*Primary Examiner*—John S. Hilten
*Assistant Examiner*—John Le
(74) *Attorney, Agent, or Firm*—John E. Kajander

(57) ABSTRACT

A circuit 17 for interfacing with a sensor 18 having a sensor input current and a modulated sensor current signal corresponding to a sensed condition. A control module 20 is coupled to the sensor 18 and receives the sensor current signal. The control module 20 converts the sensor current signal to a modulated signal having a pulse width with a duration corresponding to the sensed condition. The control module 20 counts a time corresponding to the pulse width. The time corresponds to the sensed condition.

19 Claims, 3 Drawing Sheets

MODULATED INTERFACE FOR REMOTE SIGNALS

TECHNICAL FIELD

The present invention relates generally to sensors particularly suited for automotive vehicles, and more particularly, to a circuit for interfacing with a sensor.

BACKGROUND OF THE INVENTION

Automotive vehicles typically provide a number of sensors that are used to sense various operating conditions of the vehicle. Systems that are sensor intensive include vehicle handling systems such as anti-lock brakes and traction control, and safety systems such as airbag systems.

Sensor based systems typically use a microcontroller to read multiple asynchronous remote sensor signals with serial state machines. Serial state machines such as a universal asynchronous receive transmitter (UART) are typically employed as an interface device. Typically, two UARTs are provided per sensor; one in the controller as well as one UART at each remote sensor. However, many systems have multiple sensors and therefore require multiple UARTs.

Previous systems use a digital word to transmit data between the sensor and central controller. The digital word corresponds to the sensed condition at the sensor. The digital word operates only when the sensor is to send a signal. Previous systems often generate noise emissions due to the sharp on and off transitions of the digital communication signal.

It would therefore be desirable to provide an interface for receiving signals from a remote sensor that, when implemented, uses a reduced number of components from presently known systems synchronizes remote sensor data acquisition using readily available hardware.

SUMMARY OF THE INVENTION

In one aspect of the invention, a circuit has a sensor having a sensor and a modulated sensor current signal corresponding to a sensed condition. A control module is coupled to the sensor and receives the sensor current signal. The control module converts the sensor current signal to a pulse width with a duration corresponding to the sensed condition. The control module measures a time corresponding to the pulse width. The time corresponds to the sensed condition.

In a further aspect of the invention, a method for communicating a sensed condition of a sensor comprises the steps of:

modulating a sensor current signal corresponding to a sensed condition;

generating a pulse width corresponding to the sensor current signal;

monitoring a time corresponding to said pulse width; and converting the time into a digital value, wherein the time corresponds to a sensed condition.

One advantage of the invention is that a current modulated signal from the sensor circuit to the central controller has reduced electromagnetic interference than previously known sensing circuits due to the ability of use of a substantially triangular signal with rounded transitions rather than sharp transitions. Another advantage of the invention is that drift in the remote sensor's quiescent current due to age, temperature and tolerances are tracked by the voltage comparator which uses the average current for comparison.

Other objects and features of the present invention will become apparent when viewed in light of the detailed description of the preferred embodiment when taken in conjunction with the attached drawings and appended claims.

DETAILED DESCRIPTION OF THE PREFERRED EMBODIMENT

Figure 1:
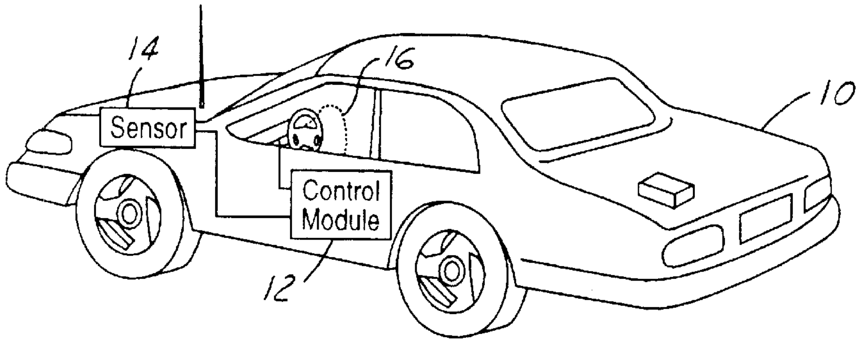
FIG. 1 is a perspective view of an automotive vehicle having a sensor interface circuit according to the present invention.

In the following figures the same reference numerals are used to identify identical components in the various figures. Although the present invention is described with respect to a sensor system for airbag deployment, the present invention may be applied to various other automotive applications such as anti-lock brakes and to non-automotive sensor applications.

Referring to FIG. 1, an automotive vehicle 10 is shown having a control module 12 coupled to a sensor 14. Control module 12 may be used to deploy an airbag 16 based on a sensed condition at sensor 14. Sensor 14 may, for example, be an accelerometer.

Figure 2:
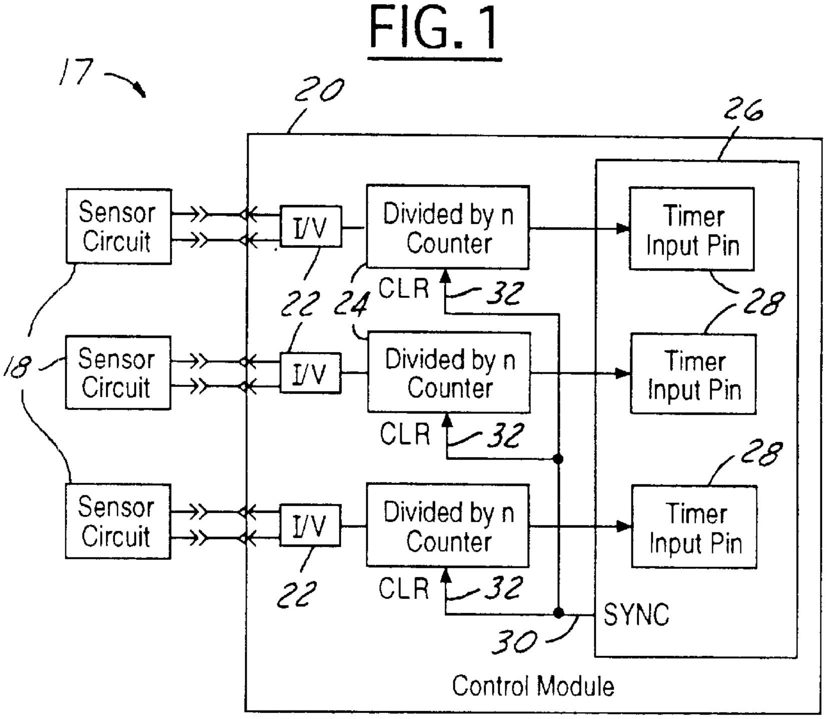
FIG. 2 is a block diagram of a sensor interface circuit according to the present invention.

Referring now to FIG. 2. the present invention is particularly suited for use in a circuit 17 employing multiple sensors in a plurality of sensor circuits 18. Sensor circuit 18 is coupled to control module 20. Control module 20 has a current-to-voltage converter 22 coupled to each sensor circuit 15. Each current-to-voltage converter 22 is coupled to a divide-by-n counter 24. Each divide-by-n counter 24 is coupled to a microcontroller 26. More specifically, microcontroller 26, is coupled to divide-by-n counter 24 through a timer input pin 28. One timer input pin 28 is provided for each divide-by-n counter 24. Timer input pins 28 are commonly found on microprocessors. Microcontroller 26 has a SYNC output 30 that is coupled to a CLR input 32 on each divide-by-n counter 24.

In the preferred implementation current-to-voltage converter 22 and divide-by-n counter 24 may be implemented in an application specific integrated circuit (ASIC).

Each sensor circuit 18 may be located in various positions in automotive vehicle or around any other product to which circuit 17 is applied.

Figure 3:
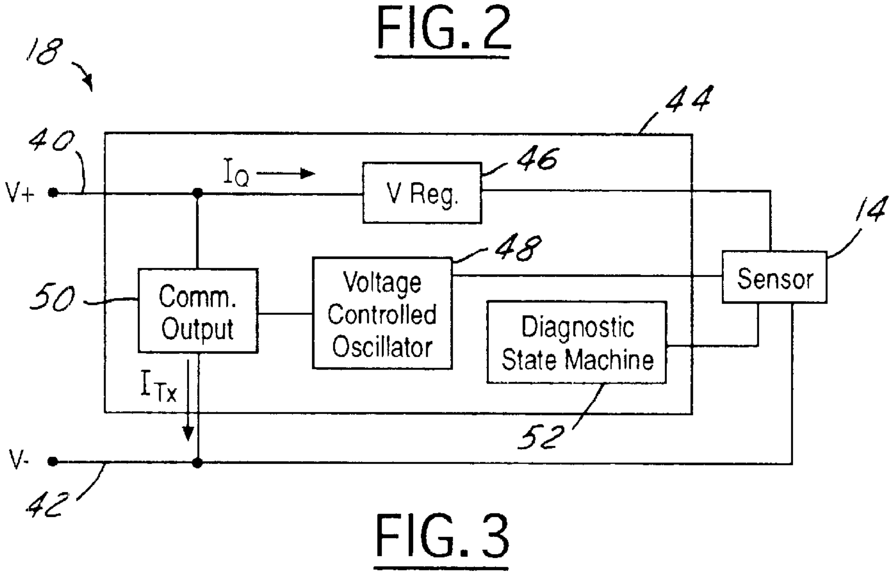
FIG. 3 is a block diagram of the sensor interface circuit of FIG. 2.

Referring now to FIG. 3, sensor circuit 18 includes sensor 14. Sensor circuit 18 is coupled between a voltage input 40 and voltage return 42. A sensor transmitter circuit 44 is coupled to sensor 14, voltage input 40 and voltage return 42. Sensor transmitter circuit 44 may include a voltage regulator 46 that is used to control the voltage to sensor 14 within predetermined limits. Commonly, sensor 14 operates at 5 volts DC.

Sensor transmitter circuit 44 includes a voltage controlled oscillator 48 and a communications output stage 50. Communication output stage 50 is coupled between voltage input 40 and voltage return 42. As will be further discussed below, voltage controlled oscillator 48 controls communication output stage 50 to modulate the transient sensor current $I_{Tx}$ with a period proportional to the output voltage of sensor 14. The input current to the sensor circuit 18 is $I_Q$. One skilled in the art would recognize frequency modulation could also be employed.

A diagnostic state machine 52 is coupled to sensor 14 and voltage controlled oscillator 48. Diagnostic state machine 52 may be used to verify proper connections of the sensor circuitry. Diagnostic state machine 52 may also be used to sense faults with the sensor circuitry. Diagnostic state machines 52 may be implemented in numerous ways as would be evident to those skilled in the art.

Figure 4A:
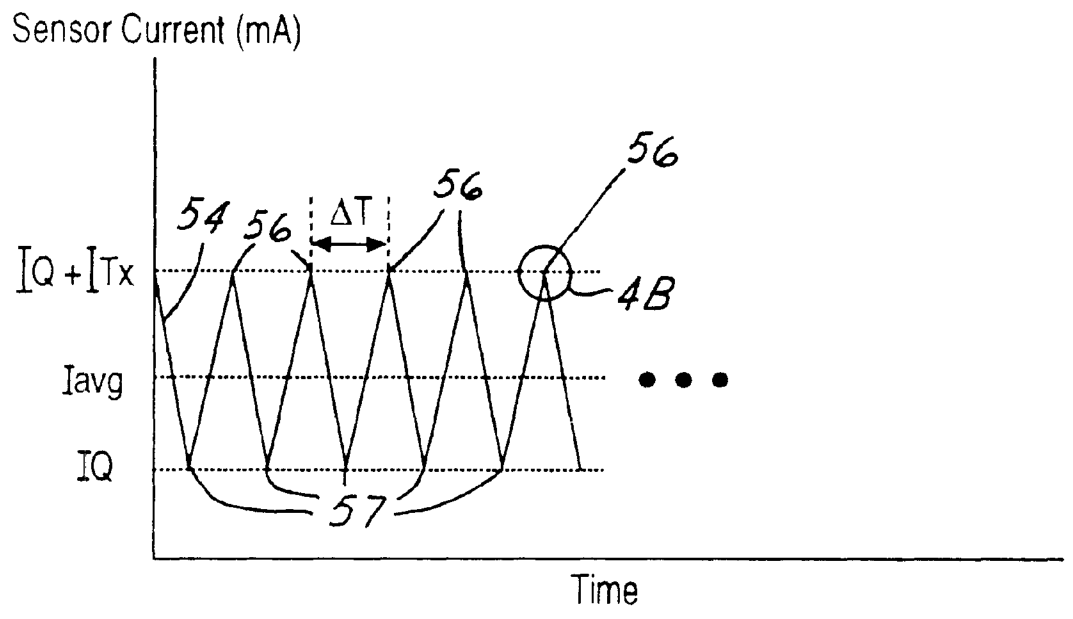
FIG. 4A is a plot of sensor current versus time of the present invention.

Referring now to FIG. 4A, the current output signal 54 of communications output stage 50 of FIG. 3 is illustrated. The current output signal sinks current which is added to the quiescent current draw $I_Q$ of the sensor circuit 18. Current output signal 54 is continuous and has an average current $I_{avg}$ and peaks 56 and valleys 57. The upper limit of signal 54 is thus $I_Q+I_{Tx}$. The lower limit of signal 54 is $I_Q$ The change in time between peaks ($\Delta T$) corresponds to the output of voltage controlled oscillator 48.

Figure 4B:
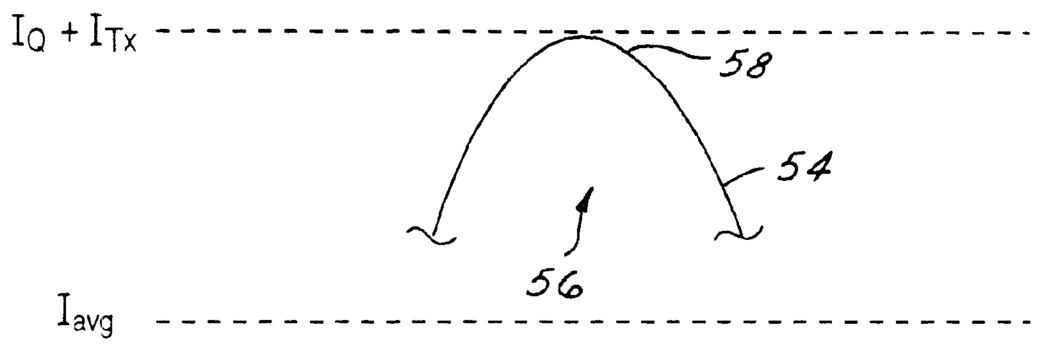
FIG. 4B is an enlarged plot of a portion of the output sensor signal of FIG. 4A.

Referring now to FIG. 4B, an enlarged portion of a peak 56 of current output signal 54 is illustrated. Peak 56 has a rounded portion 58 to reduce the amount of electromagnetic interference generated from the current output signal 54. Valleys 57 (of FIG. 4A) are also preferably rounded in a similar manner.

Figure 5:
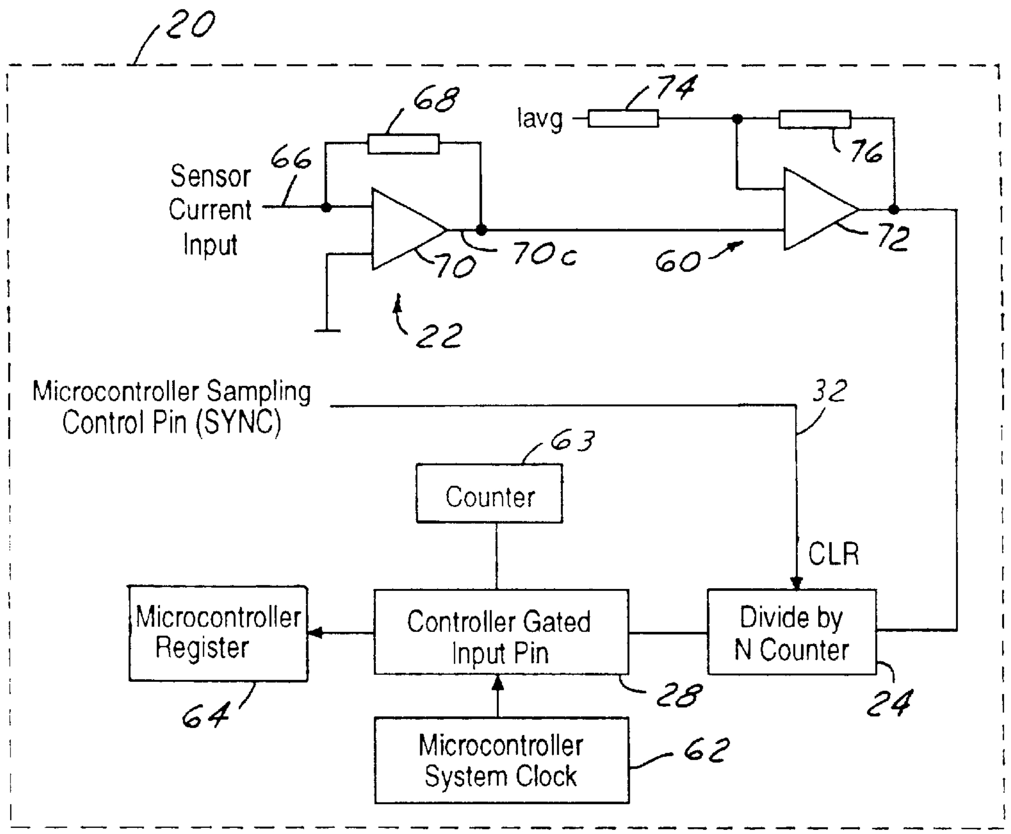
FIG. 5 is a block diagram of a interface circuit for a controller according to the present invention.

Referring now to FIG. 5, a more detailed schematic of control module 20 is illustrated. Generally, current-to-voltage converter 22 is coupled to a comparator circuit 60. Comparator circuit 60 is coupled to divide-by-n counter 24. Divide-by-n counter 24 has a clear CLR input 32. Divide-by-n counter 24 is coupled to input pin 28 of microcontroller shown above in FIG. 2. The microcontroller also has a system clock 62 and a counter 63. The output from microcontroller is coupled to a microcontroller register 64. Microcontroller register 64 stores a value that corresponds to the sense condition at the sensor. The value stored in register 64 may be used by the system to deploy an airbag if the sensor is an accelerometer for an airbag circuit or change other vehicle parameters. The value may, for example, be a count from counter 63 of the number of clock cycles within a pulse width.

Current-to-voltage converter 22 has a sensor current input 66 that is coupled to the output of sensor transmitter circuit 44 shown above in FIG. 3. Sensor current input 66 receives a signal such as that shown in FIG. 4A. Current-to-voltage converter may include an operational amplifier 70. A feedback component such as a resistor 68 is coupled to sensor current input 66 and output 70C to convert the current signal into a voltage signal.

Comparator circuit 60 includes a comparator 72 that is coupled to output 70C of operational amplifier 70 and to the average current $I_{avg}$ of the signal of FIG. 4A. The $I_{avg}$ signal may be obtained by feeding the signal of FIG. 4A through a low pass filter as would be evident to those skilled in the art. The quiescent current of a sensor has a tendency to change with age, temperature and tolerances. By using the $I_{avg}$ current, the voltage differences over time are thereby tracked by comparator circuit 60. Comparator circuit 72 may also include circuit components 74 and 76 to obtain the desired output signal from comparator 72.

The output of comparator circuit 72 is coupled to divide-by-n counter 24. Divide-by-n counter 24 is used to synchronize the sampling of data with the microcontroller system clock 62.

Figure 6:
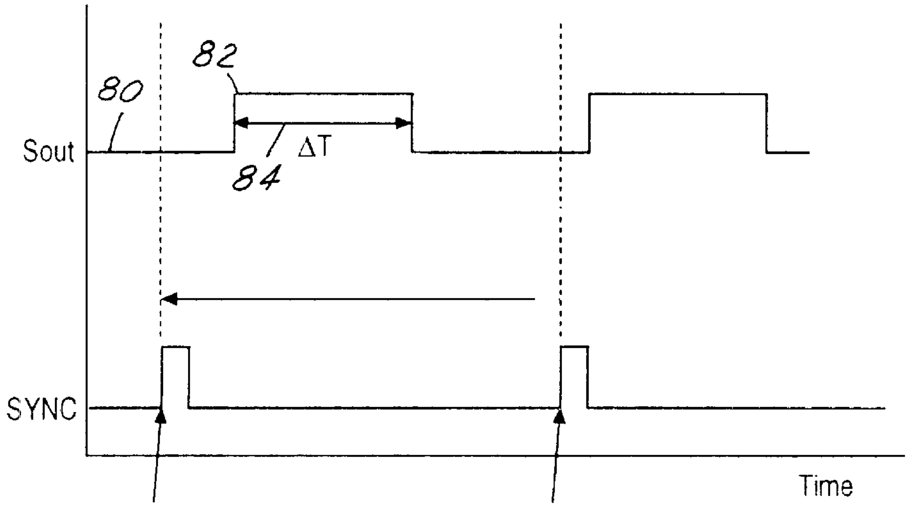
FIG. 6 is a plot of a sensor output and SYNC signal according to the present invention.

Referring now to FIG. 6, signal 80 is the output of divide-by-n counter 24. Signal 80 has a pulse 82 having a width 84 that corresponds to the sensed condition at the sensor. Signal 80 is coupled to the input pin 28 of the microcontroller. SYNC signal 86 allows the microcontroller to synchronize the sampling of data to its software execution timing. The number of system clock pulses within pulse width 84 is counted by a counter 63 within the microcontroller. The number of clock pulses present within the pulse width 84 of pulse 82 corresponds to the sensed condition at sensor 14. The count is stored within register 64. The system into which this circuit is employed may then monitor register 64 and adjust operation accordingly.

Advantageously, because many standard microcontrollers contain several input timer pins, no UARTs are required by the microcontroller. This reduces the overall system cost. Also, one SYNC signal may be used to synchronize data from several sensors. This reduces the number of asynchronous events that the software of the microcontroller must handle. This increases the software throughput for analysis of the remote sensor signals.

While particular embodiments of the invention have been shown and described, numerous variations and alternate embodiments will occur to those skilled in the art. Accordingly, it is intended that the invention be limited only in terms of the appended claims.

What is claimed is:

1. A circuit comprising:

a sensor circuit having a sensor, a sensor input current and a modulated sensor current signal corresponding to a sensed condition; and a control module coupled to said sensor and receiving said sensor current signal, said control module converting said sensor current signal to a modulated signal having a pulse width corresponding to the sensed condition, said control module counting a time corresponding to the pulse width, said time corresponds to the sensed condition.

2. A circuit as recited in claim 1 wherein said control module comprises a current-to-voltage converter.

3. A circuit as recited in claim 1 wherein said control module comprises a comparator circuit.

4. A circuit as recited in claim 3 further comprising a current-to-voltage converter, said comparator has a first input coupled to an output of said converter and a second input coupled to an average signal input corresponding to an average of a signal to said current-to-voltage converter.

5. A circuit as recited in claim 3 wherein said control module comprises a divide-by-n counter coupled to said comparator circuit.

6. A circuit as recited in claim 3 wherein said control module comprises a microcontroller having a counter for counting said pulse width.

7. A circuit as recited in claim 6 wherein said microcontroller comprises a clock, a register and an input pin, said counter counting a number of clock pulses within a said pulse width, said microcontroller storing said value within said register.

8. A circuit as recited in claim 1 wherein said output signal is continuous.

9. A circuit as recited in claim 1 wherein said sensor circuit further comprises a voltage regulator coupled to said sensor for regulating a sensor voltage.

10. An interface circuit for remote signals from a sensor comprising:

a voltage oscillator oscillating an output current from the sensor;

a current-to-voltage converter coupled to said voltage oscillator, said current-to-voltage converter circuit converting said output current to a sensor voltage signal;

a comparator circuit coupled to said current-to-voltage converting said sensor voltage signal to a digital sensor signal;

a divide-by-n counter converting said digital sensor signal into a pulse width signal having a pulse width; and a microcontroller having a clock and a counter, said counter counting a number of clock cycles corresponding to said pulse width, said count corresponding to the sensed condition of the sensor.

11. An interface circuit as recited in claim 10 wherein said microcontroller generates a synchronizing signal and said divide-by-n counter has a synchronizing input coupled to said synchronizing signal.

12. An interface circuit as recited in claim 10 further comprising a register in said microcontroller, said register storing said count.

13. An interface circuit as recited in claim 10 wherein said comparator circuit comparing said sensor voltage signal to a voltage indicative of an average current.

14. An interface circuit as recited in claim 10 further comprising a voltage regulator coupled to said sensor for regulating a sensor voltage.

15. An interface circuit as recited in claim 10 further comprising a diagnostic state machine.

16. A method for communicating a sensed condition of a sensor comprising the step of:

modulating a sensor current signal corresponding to a sensed condition;

generating a pulse width corresponding to the sensor current signal;

monitoring a time corresponding to said pulse width; and converting the time into a digital signal, wherein the time corresponds to a sensed condition.

17. A method as recited in claim 16 wherein the step of modulating comprises the steps of voltage controlled oscillating a transient current of the sensor.

18. A method as recited in claim 16 wherein the steps of generating a pulse width comprises the step of converting the current sensor signal into a voltage signal; and comparing the voltage signal to a predetermined voltage to obtain a comparator output signal.

19. A method as recited in claim 18 further comprising the step of generating an average signal corresponding to an average of the sensor current signal, wherein the step of comparing the voltage signal comprises the steps of comparing the voltage signal to the average signal.

* * * * *